(12) United States Patent
Mu et al.

(10) Patent No.: US 7,599,675 B2
(45) Date of Patent: Oct. 6, 2009

(54) METHOD AND APPARATUS FOR RECEIVING RADIO FREQUENCY SIGNALS

(75) Inventors: Fenghao Mu, Hjärup (SE); Andreas T. Mårtensson, Staffanstorp (SE); Magnus Nilsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 493 days.

(21) Appl. No.: 11/609,399

(22) Filed: Dec. 12, 2006

(65) Prior Publication Data

US 2008/0139149 A1 Jun. 12, 2008

(51) Int. Cl.
*H04B 1/06* (2006.01)
(52) U.S. Cl. .................... 455/240.1; 455/260; 455/340; 375/345
(58) Field of Classification Search .................. 455/230, 455/232.1, 234.1, 240.1, 250–260, 334, 338–341; 375/345
See application file for complete search history.

(56) References Cited

U.S. PATENT DOCUMENTS

| | | | |
|---|---|---|---|
| 5,821,802 A | 10/1998 | Yuen | |
| 6,057,714 A | 5/2000 | Andrys et al. | |
| 6,088,581 A * | 7/2000 | Bickley et al. | 455/131 |
| 6,275,687 B1 | 8/2001 | Lloyd | |
| 6,393,260 B1 | 5/2002 | Murtojarvi et al. | |
| 6,653,885 B2 | 11/2003 | Wu et al. | |
| 6,735,422 B1 * | 5/2004 | Baldwin et al. | 455/232.1 |
| 6,782,062 B1 | 8/2004 | Wieck | |
| 6,847,808 B2 | 1/2005 | Zhou | |
| 6,999,747 B2 | 2/2006 | Su | |
| 7,020,452 B1 * | 3/2006 | Kobayashi | 455/326 |
| 7,102,411 B2 | 9/2006 | Behzad | |

(Continued)

FOREIGN PATENT DOCUMENTS

WO 03/077418 9/2003

OTHER PUBLICATIONS

Nam, I et al. "Single-Ended Differential Amplifier and Mixer Circuits Utilizing Complementary MOS Devices." Journal of Semiconductor Technology and Science, vol. 2, No. 1, Mar. 2002.

(Continued)

*Primary Examiner*—Nhan T Le
(74) *Attorney, Agent, or Firm*—Coats & Bennett, P.L.L.C.

(57) ABSTRACT

A frequency conversion receiver comprises a passive mixer, a Low-Noise Amplifier (LNA) and a balun. The low-noise amplifier generates an amplified single-ended signal responsive to a single-ended receiver input signal. The passive mixer generates a mixer output signal responsive to a differential mixer input signal and a four-phase local oscillator signal. The balun transforms the amplified singled-ended signal into the differential mixer input signal, the balun having a first winding coupled to an output of the low-noise amplifier and a second winding coupled to an input of the passive mixer, the second winding having more turns than the first winding. The turn ratio of the second winding to the first winding provides gain compensation to the low-noise amplifier, and in conjunction with the low-noise amplifier and the passive mixer, provides a desired gain to the receiver and linearity over a dynamic range of the receiver input signal.

25 Claims, 7 Drawing Sheets

U.S. PATENT DOCUMENTS

| | | | |
|---|---|---|---|
| 7,299,021 B2 * | 11/2007 | Parssinen et al. | 455/226.1 |
| 7,489,914 B2 * | 2/2009 | Govind et al. | 455/168.1 |
| 7,542,735 B2 * | 6/2009 | Kintis et al. | 455/114.1 |
| 2002/0032016 A1 | 3/2002 | Ji | |
| 2002/0163375 A1 | 11/2002 | Wu et al. | |
| 2003/0114129 A1 | 6/2003 | Jerng | |
| 2003/0130006 A1 * | 7/2003 | Reynolds | 455/550 |
| 2005/0164669 A1 | 7/2005 | Molnar et al. | |
| 2005/0221775 A1 | 10/2005 | Abdelli | |
| 2006/0164171 A1 | 7/2006 | Wu | |

OTHER PUBLICATIONS

Zhou, S et al. "A CMOS Passive Mixer with Low Flicker Noise for Low-Power Direct-Conversion Receiver." IEEE Journal of Solid-State Circuits (JSSC), pp. 1084-1093, May 2005.

Zhou, Y et al. "A 5 GHz Dual Mode WiMAX/WLAN Direct-Conversion Receiver." 2006 IEEE Symposium on Circuits and Systems, ISCAS 2006, May 21-24, 2006.

Shahani, Arvin R et al. "A 12-mW Wide Dynamic Range CMOS Front-End for a Portable GPS Receiver." IEEE Journal of Solid-State Circuits, vol. 32, No. 12, Dec. 1997, pp. 2061-2070.

* cited by examiner

METHOD AND APPARATUS FOR RECEIVING RADIO FREQUENCY SIGNALS

TECHNICAL FIELD

The present invention generally relates to all wireless receivers, and particularly relates to direct frequency down conversion of radio frequency signals in wireless receivers.

BACKGROUND

Information is transmitted in many wireless applications using Radio Frequency (RF) signals. RF signals are formed by modulating a baseband signal (information) onto a carrier signal, the carrier signal having a frequency greater than the baseband signal frequency. Upon reception, an RF signal is finally down converted to a desired baseband frequency before baseband signal processing occurs. RF signals may be directly down converted or may be processed by one or more intermediate stages before finally being converted to a desired baseband frequency.

A heterodyne-based receiver down converts a received RF signal via one or more intermediate frequency (IF) stages until a desired baseband frequency is obtained. Each IF stage comprises a mixer, a filter and/or an amplifier stage. The output of a particular IF stage has a frequency corresponding to the difference between a local oscillation signal input to the mixer and the frequency of the RF (or IF) input signal.

A homodyne-based receiver eliminates the need for IF stages by directly down converting a received RF signal to a desired baseband frequency signal. As such, homodyne-based receivers tend to use fewer components than their heterodyne counterparts, thus resulting in size and power advantages. A direct-conversion homodyne receiver conventionally includes a RF receiver front-end which comprises a Low Noise Amplifier (LNA) for amplifying a received RF signal, a mixer for directly down converting the amplified RF signal to a desired baseband frequency signal and an impedance matching circuit for matching the output impedance of the LNA to the input impedance of the mixer. In full-duplex homodyne receivers, a surface acoustic wave filter is conventionally included to filter interference injected from the transmitter to the receiver during simultaneous operation.

Various challenges exist when directly down converting an RF signal to a desired baseband frequency signal, particularly when the components used for direct conversion are integrated onto the same silicon die using a deep sub-micron CMOS technology. Deep-submicron CMOS technologies offer low supply voltages. A low supply voltage limits the linear operating range of an LNA. That is, a limited supply voltage limits the output voltage range of the LNA, thus causing it to desensitize the gain for weak wanted signals. As such, the LNA operates in a nonlinear region when processing high level signal components of an RF signal unless the gain of the LNA is adjusted downward. To avoid desensitization of the gain for weak wanted signals, good linearity is required for the RF receiver front-end. Normally, passive mixers provide better linearity than active mixers. However, passive mixers become difficult to use because passive mixers have negative gain and the total gain provided by the LNA and mixer is not enough, which results in low RF receiver front-end gain. Low RF receiver front-end gain requires that circuits following the mixer must be designed with low noise circuitry.

To compensate for reduced LNA gain, active mixers are conventionally used. Although active mixers provide additional gain, they consume more power than their passive mixer counterparts. Active mixers also have poor linearity. Further, flicker noise is present in active mixers. Although flicker noise does not affect high frequency signals, it does adversely affect low frequency signals such as narrowband GSM baseband signals. Flicker noise may be reduced by increasing the size of transistors included in an active mixer. However, larger transistors consume more power. In addition to power consumption and flicker noise concerns, active mixers also have a DC offset, thus causing level shift at the mixer output. Passive mixers cure many of the disadvantages associated with active mixers. However, passive mixers generally have negative gain. As such, it is increasingly difficult to use traditional passive mixers and LNAs using deep sub-micron CMOS technologies due to the low voltage margin associated with such technologies and insufficient gain.

SUMMARY

According to the methods and apparatus taught herein, down conversion of a received RF signal to a baseband signal is achieved using a receiver having a passive mixer, a balun and a Low-Noise Amplifier (LNA). Gain of the LNA is reduced to minimize nonlinearity which arises when signals output by the LNA approach or exceed the linear voltage output range of the LNA. The balun couples the LNA output to the passive mixer input. To compensate for any gain shortfalls that may result from using the passive mixer or reducing LNA gain, the balun comprises a primary winding coupled to the LNA output and a secondary winding coupled to the passive mixer input. The secondary winding has more turns than that of the primary winding, thus providing voltage gain between the LNA output and the passive mixer input. The transformer turn ratio is selected to provide both sufficient voltage gain and impedance matching between the LNA output and passive mixer input.

The secondary winding of the balun may be biased with a DC voltage that serves as a bias voltage for the passive mixer. Passive mixer nonlinearity may be minimized by using a complementary passive mixer having both P-FET and N-FET transistors. Thus, by properly selecting the bias voltage and sizing the P-FET and N-FET devices, the resulting passive mixer nonlinearity partly cancels or reduces LNA nonlinearity, thus improving the overall linearity of the receiver. Since the balun provides voltage gain to compensate for negative gain in the mixer, the LNA gain may be maintained relatively low to reduce the LNA nonlinearity. Low LNA gain also relaxes LNA design constraints so that low LNA output impedance can be used. Low LNA output impedance advantageously improves the frequency tuning range of the receiver. As such, proper selection of the balun transformer turn ratio and biasing of the balun enables the receiver to down convert received RF signals using a passive mixer without sacrificing voltage gain or linearity.

According to one embodiment of the down conversion receiver, the receiver comprises a passive mixer, a low-noise amplifier and a balun. The low-noise amplifier is configured to generate an amplified single-ended signal responsive to a single-ended receiver input signal. The passive mixer is configured to generate a mixer output signal responsive to a differential mixer input signal and a four-phase local oscillator signal. The balun is configured to transform the amplified singled-ended signal into the differential mixer input signal, the balun having a first winding coupled to an output of the low-noise amplifier and a second winding coupled to an input of the passive mixer, the second winding having more turns than the first winding. The turn ratio of the second winding to the first winding is configured to provide gain compensation to the low-noise amplifier, and in conjunction with the low-noise amplifier and the passive mixer, to provide a desired gain to the receiver and linearity over a dynamic range of the receiver input signal.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
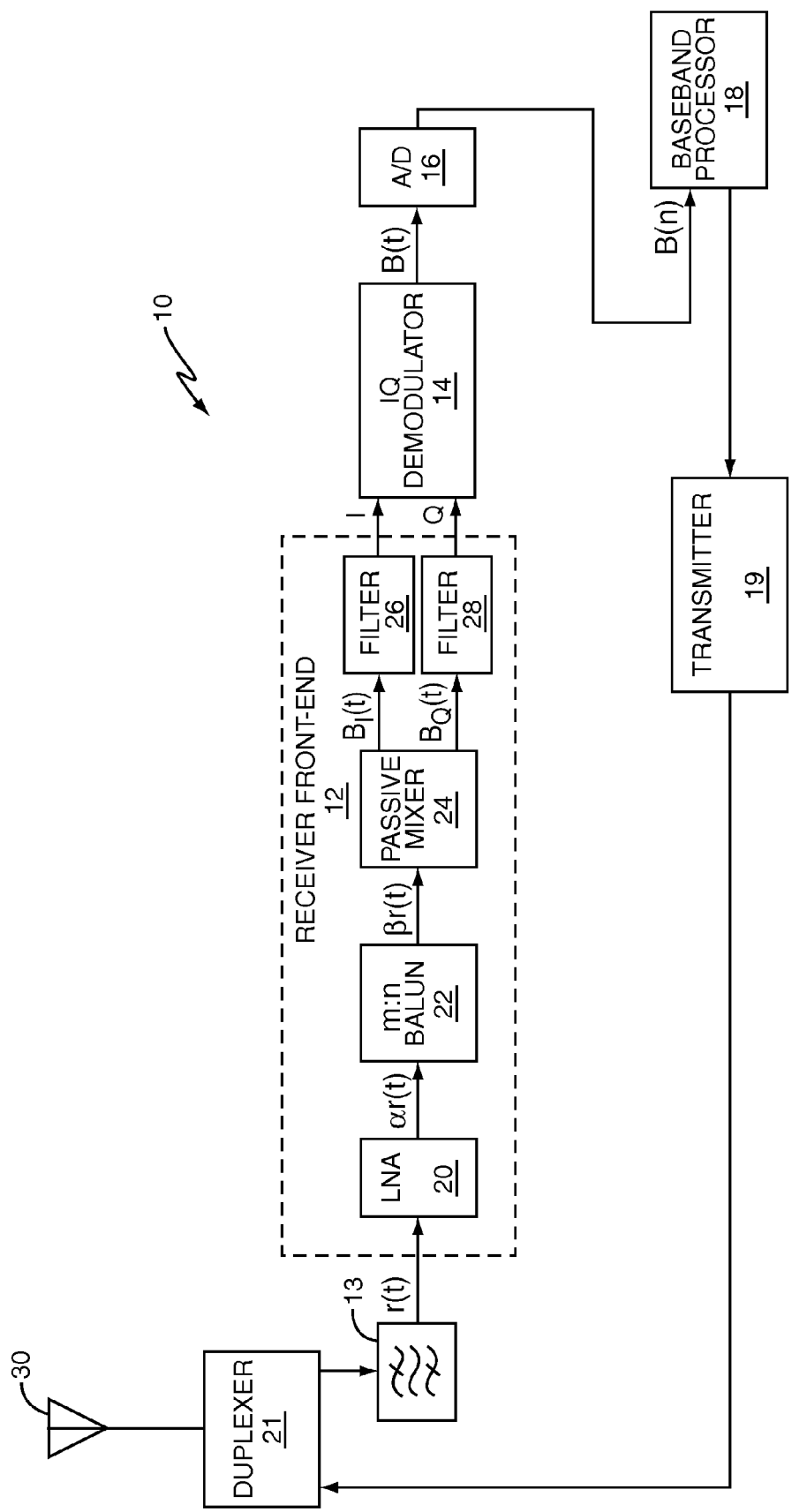
FIG. 1 is a block diagram of one embodiment of a wireless communication device including a frequency down conversion receiver.

FIG. 1 illustrates an embodiment of a wireless communication device 10 such as a mobile phone, radio, cordless telephone, personal digital assistant, global positioning system, wireless Local Area Network (WLAN) adapter such as a wireless network interface controller, etc. The wireless device 10 receives and transmits information via RF signals. The device 10 includes a receiver front-end 12 for down converting a received RF signal r(t) to a desired baseband frequency signal $B_I(t)/B_Q(t)$. Received signals are filtered, e.g., by a bandpass filter 13, before being processed by the receiver front-end 12. The device 10 also includes a demodulator 14, an analog-to-digital converter 16 and a baseband processor 18 for processing the baseband signal B(n), e.g., by performing decoding, symbol estimation, interference cancellation, bit synchronization, error correction, etc. Alternatively, the baseband processor 18 also performs signal demodulation. For heterodyne-based receivers, one or more intermediate-frequency (IF) stages (not shown) are included between the receiver front-end 12 and the demodulator 14 for down-converting the received signal in successive steps. The wireless device 10 also includes a transmitter 19 to transmit information via RF signals and a duplexer 21 for enabling full duplex (receive and transmit) operation.

The receiver front-end 12 comprises a Low-Noise Amplifier (LNA) 20, a balun 22, a passive mixer 24 and filters 26 and 28. The receiver front-end 12 provides sufficient signal gain so that components downstream from the receiver front-end 12 operate properly in the presence of noise. Although the passive mixer 24 mitigates the flicker noise and power consumption drawbacks associated with active mixers, it has negative gain. Further, the LNA 20 operates with reduced gain to minimize LNA nonlinearity as will be described later. To compensate for any gain shortfall, the balun 22 comprises a transformer having an m:n ratio of primary winding turns (m) to secondary winding turns (n), the secondary winding being coupled to inputs of the passive mixer 24 and the primary winding being coupled to an output of the LNA 20. The secondary winding has more turns than does the primary winding, i.e., n>m, thus providing positive voltage gain at the secondary winding.

The transformer turn ratio m:n is selected to provide at least enough voltage gain to compensate for the reduced gain of the LNA 20 and the use of passive mixer 24. That is, the balun 22 compensates for the gain shortfall between the total desired receiver front-end gain and the gain provided by the LNA 20 and passive mixer 24. The transformer turn ratio is also selected to provide sufficient impedance matching between the output impedance of the LNA 20 (which tends to be low) and the input impedance of the passive mixer 24 (which tends to be high). Further, if LNA nonlinearity remains, the passive mixer 24 may be biased by providing a DC voltage to the center tap of the secondary winding. Proper selection of the DC bias voltage enables the passive mixer 24 to counteract LNA nonlinearity as will be described in detail later. Also, by having more turns on the secondary winding, local oscillator clock signal leakage from the passive mixer 24 to antenna 30 is reduced since local oscillator clock signals at the primary winding have negative voltage gain due to backward transformation. Thus, by properly selecting the transformer turn ratio and appropriately biasing the balun 22, impedance matching is achieved and the receiver front-end gain requirement satisfied while minimizing the effects of LNA nonlinearity.

In more detail, the received RF signal r(t) is amplified by the LNA 20. The LNA 20 has a gain α that is less than the desired total receiver front-end gain. The LNA gain is selected to reduce LNA nonlinearity, particularly when the LNA 20 amplifies high level signal components of the RF signal r(t). Maintaining the LNA gain sufficiently low when the LNA 20 amplifies high level signal components reduces LNA nonlinearity caused by a limited output voltage range of the LNA 20. Lower LNA gain allows lower LNA output impedance. The frequency tuning range of the receiver front end 12 is beneficially increased when LNA output impedance is low as will be described in detail later.

The balun 22, which inductively couples the output of the LNA 20 to the inputs of the passive mixer 24, transforms the amplified signal αr(t) into a differential signal having total voltage gain of β. The total voltage gain β is the sum of the LNA voltage gain α and the balun voltage gain λ, where λ≈n/m when the balun 22 is lossless. The passive mixer 24 directly down coverts the mixer input signal βr(t) to In-phase and Quadrature (I/Q) signals, $B_I(t)$ and $B_Q(t)$. The demodulator 14 recovers the baseband information B(t) by demodulating the I/Q signals.

Returning to the balun 22, its voltage gain λ is a function of the ratio $$\left[\frac{n}{m}\right]$$

where n is the number of secondary transformer winding turns and m is the number of primary winding turns. Thus, to increase the balun voltage gain, the ratio of secondary to primary winding turns is increased. The transformer turn ratio is also selected such that a desired impedance matching between the output of the LNA 20 and the input of the passive mixer 24 is realized. If the balun 22 is lossless, the impedance seen by the LNA 20 looking into the primary coil of the balun 22 ($Z_{prm}$) is related to the impedance seen by the passive mixer 24 looking into the secondary coil of the balun 22 ($Z_{sec}$) as given by:

$$\frac{Z_{prm}}{Z_{sec}} = \left[\frac{m}{n}\right]^2 \quad (1)$$

Thus, the output impedance of the LNA 20 ($Z_{LNA}$) may be sufficiently matched to the input impedance of the passive mixer 24 ($Z_{MIX}$) by selecting a transformer turn ratio that satisfies $$\left[\frac{m}{n}\right]^2 = \frac{Z_{LNA}}{Z_{MIX}} \quad (2)$$

Accordingly, the greater the impedance ratio of $Z_{MIX}$ to $Z_{LNA}$, the greater the ratio of secondary winding turns to primary winding turns. Since $Z_{LNA} \ll Z_{MIX}$ for most integrated circuit implementations, it is feasible to have n>m, thus positive voltage gain is achieved. The transformer turn ratio may be set once, e.g., during circuit design or may be programmable. Regardless, the selection of the transformer turn ratio enables the receiver front-end 12 to utilize a passive mixer 24 and a reduced gain LNA 20 without sacrificing gain or linearity.

Figure 2:
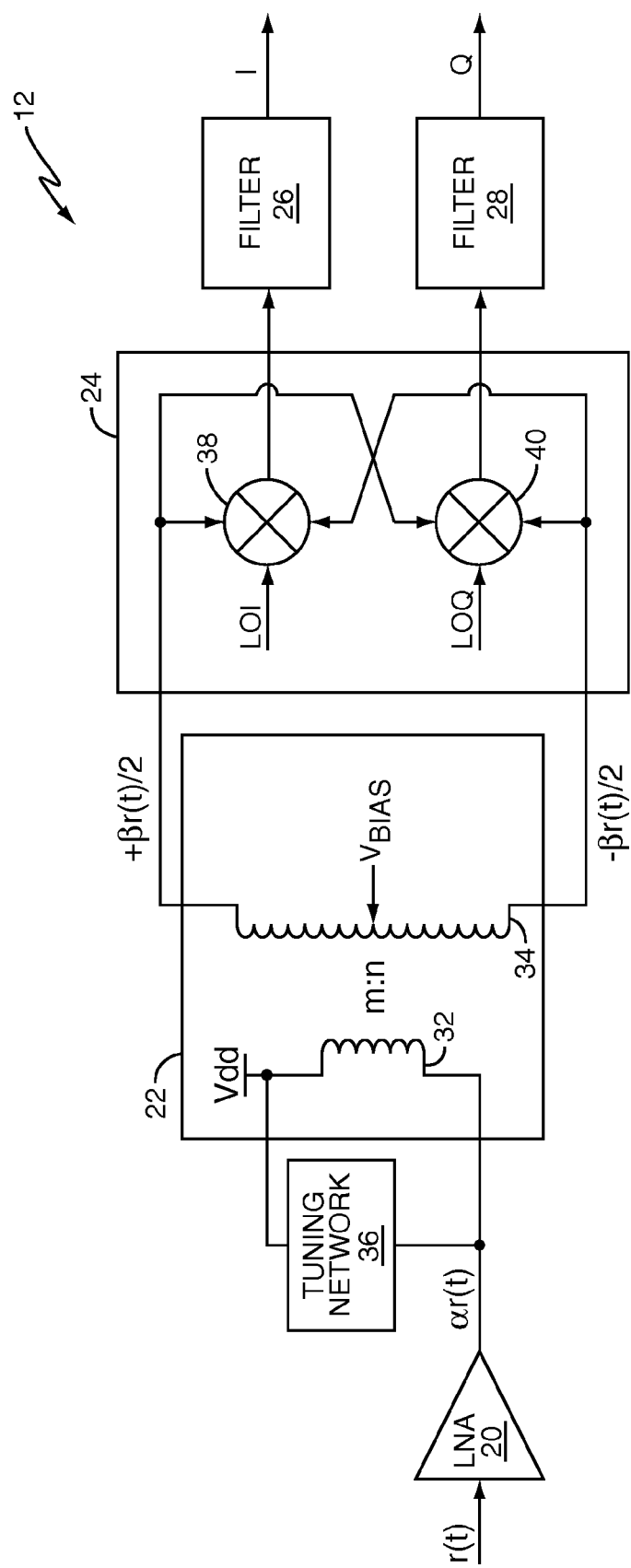
FIG. 2 is a block diagram of one embodiment of a frequency down conversion receiver.

FIG. 2 illustrates an embodiment of the receiver front-end 12. The amplified LNA output signal αr(t) excites one end of a primary transformer winding 32 while the opposite end is connected to a DC supply voltage Vdd. The balun 22 transforms the amplified LNA output signal to a differential signal via a secondary winding 34 with voltage gain λ of the balun 22 being a function of the ratio $$\left[\frac{n}{m}\right] > 1.$$

The number of primary and secondary winding turns is selected to provide sufficient impedance matching and gain compensation as previously described. A tuning network 36 adjusts the frequency range of the receiver front end 12. The differential signal output by the balun 22 is input to the passive mixer 24.

The passive mixer 24 includes an in-phase mixer 38 (I-channel mixer) and a quadrature mixer 40 (Q-channel mixer). The differential balun output signals +βr(t)/2 and −βr(t)/2 are provided to the I/Q-channel mixer 38 and 40, respectively. The I/Q-channel mixer 38 and 40 down-converts the mixer input signals by multiplying the signals with local oscillation signals. The local oscillation signals may be multi-phase as described in detail later. Regardless, the filters 26 and 28, e.g., low pass or bandpass filters, remove high frequency products of the mixing process to yield I/Q signals having a desired baseband frequency. The desired baseband frequency is a function of the local oscillation frequency and RF input signal frequency as is well known in the art.

According to this embodiment and equations (1) and (2), the impedance at the primary winding 32 of the balun 22 is a function of the impedance at the secondary winding 34 and the ratio m:n of primary winding turns (m) to secondary winding turns (n). The impedance at the secondary winding 34 is related to the input impedance of the passive mixer 24.

The input impedance of the passive mixer 24 is a function of the mixer's output impedance and the input impedance of the filters 26 and 28. When configured for homodyne-based direct conversion, the filters 26 and 28 are configured as baseband low pass filters. When configured for heterodyne-based frequency down-conversion, the filters 26 and 28 are configured as intermediate frequency (IF) bandpass filters.

The amount of signal attenuation provided by the filters 26 and 28 is frequency dependent. Thus, the input impedance of the filters 26 and 28 depends on the frequency of the signals to be filtered. The filters 26 and 28 have an input impedance that is lower for stop band frequencies than it is for pass band frequencies. For example, when configured for homodyne-based direct conversion, the filters 26 and 28 may comprise a first order RC low pass filter having a resistor and capacitor where one node of the resistor is connected to one node of the capacitor to form an output node while the other node of the resistor forms the input node of the low pass filter. The capacitor is connected to ground and provides high input impedance at lower frequencies for in-band frequency components and low impedance at higher frequencies for out-band frequency components.

The impedance of the filters 26 and 28 is reflected at the output of LNA 20 through the balun 22. Thus, lower impedance for out-of-band frequency components results in low LNA gain. Accordingly, the LNA 20 will have different gains for desired in-band and undesired out-of-band RF input signals. Particularly, the LNA 20 has a higher gain for desired in-band signals than for undesired out-of-band signals, thus improving the frequency selectivity of the receiver front end 12.

Power may leak from the transmit side of the device to the receive side when the device 10 operates in full duplex mode, i.e., when the device 10 transmits and receives signals simultaneously, e.g., in WCDMA applications. During full duplex operation, power leakage from the transmitter 19 to the receiver front-end 12 is often the largest source of interference power present at the input to LNA 20. The configuration of the receiver front end 12 attenuates signals transmitted by the transmitter 19 in the filters at the mixer 24 base-band side for homodyne direct down-conversion (or intermediate frequency side for heterodyne down conversion), and through the passive mixer 24 impedance transformation, the transmitted signals are also attenuated at the input of the mixer 24. Because the balun 22 inductively couples the LNA 20 to the passive mixer 24, signals transmitted by the transmitter 19 are also attenuated at the LNA 20. Attenuating signals transmitted by the device 10 at the LNA 20 reduces transmission power leakage caused by the transmitter 19. Also, maintaining low LNA output impedance improves receiver front end linearity while reducing desensitization caused by power leakage from the transmitter 19.

According to this embodiment, the secondary winding 32 of the balun 22 is biased at a selected DC voltage $V_{bias}$. The bias voltage is injected into the secondary winding 32 via a winding tap, preferably a center tap. The secondary winding 34 provides the bias voltage to the drain/source of transistors (not shown) forming the passive mixer 24. When biased at a proper DC voltage, the transistors contribute to the nonlinearity of the passive mixer 24 due to non-ideal switching property of the transistors, e.g., FET or MOSFET devices. The passive mixer 24 may be a complementary passive mixer which minimizes nonlinearity when its transistors are properly balanced and an appropriate secondary winding bias voltage is selected as will be described in detail later. Even though LNA gain may be reduced to mitigate nonlinearity, some LNA nonlinearity may remain, particularly when the LNA 20 amplifies high level signal components of a received RF signal. The nonlinearity introduced by the passive mixer 24 may be designed to partly cancel LNA nonlinearity by appropriately selecting the secondary winding bias voltage and properly sizing the devices forming the complementary passive mixer 24.

Figure 3:
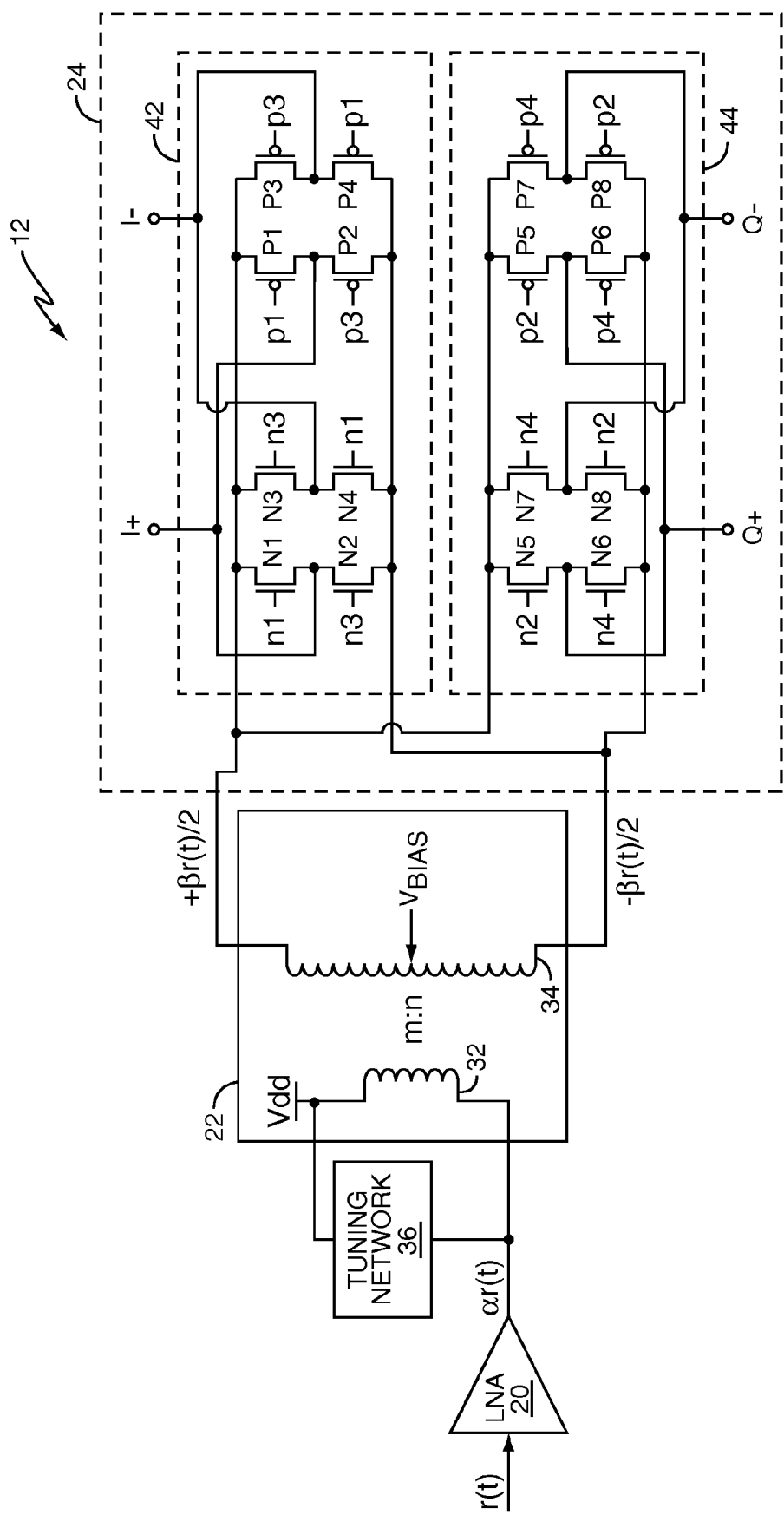
FIG. 3 is a block diagram of another embodiment of a frequency down conversion receiver.

FIG. 3 illustrates another embodiment of the receiver front-end 12 where I-channel mixer 42 and Q-channel mixer 44 in the passive mixer 24 are complimentary mixers. Each complimentary mixer comprises four N-FETs (N1-N4 in I-channel mixer 42 and N5-N8 in Q-channel mixer 44) and four P-FETs (P1-P4 in I-channel mixer 42 and P5-P8 in Q-channel mixer 44). Nonlinearity introduced by the complimentary passive mixer 24 counteracts LNA nonlinearity when the transistors N1-N8 and P1-P8 are properly sized and biased.

In more detail, the I-channel mixer 42 comprises two sets of cascaded N-FET transistors (N1-N4) clocked by positive local oscillation signals (n1 and n3) and two sets of cascaded P-FET transistors (P1-P4) clocked by negative local oscillation signals (p1 and p3). Similarly, the Q-channel mixer 44 also comprises two sets of cascaded N-FET transistors (N5-N8) clocked by positive local oscillation signals (n2 and n4) and two sets of cascaded P-FET transistors (P5-P8) clocked by negative local oscillation signals (p2 and p4).

The cascaded sets of N-FET and P-FET transistors in each I/Q-channel mixer 42 and 44 share two common nodes, one common node being coupled to a first end of the secondary winding 34 and the other common node being coupled to the opposite end. For example, the end of the secondary winding 34 that outputs the signal $+\beta r(t)/2$ is coupled to the common node shared by transistors N1, N3, P1 and P3 in the I-channel mixer 42 and transistors N5, N7, P5 and P7 in the Q-channel mixer 44. Likewise, the end of the secondary winding 34 that outputs the signal $-\beta r(t)/2$ is coupled to the common node shared by transistors N2, N4, P2 and P4 in the I-channel mixer 42 and transistors N6, N8, P6 and P8 in the Q-channel mixer 44.

Figure 4:
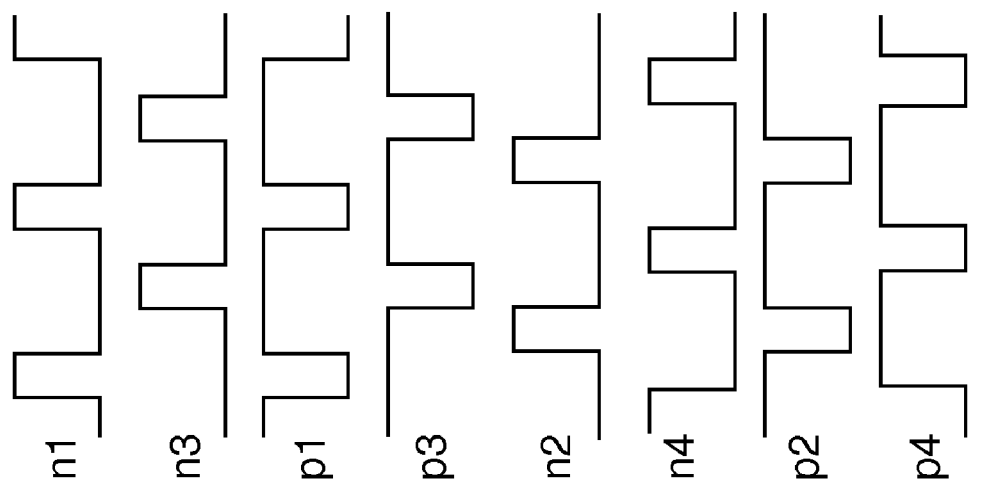
FIG. 4 is a timing diagram illustrating a four-phase local oscillation signal for use with a passive mixer.

During operation, the transistors in the I/Q-channel mixers 42 and 44 operate as switches, their operation being controlled by local oscillation clock signals having four phases. Two clock signals (n1 and n3) and their complements (p1 and p3) have first and third phases that control the transistor gates of the I-channel mixer 42. Two other clock signals (n2 and n4) and their complement signals (p2 and p4) have second and fourth phases that control the transistor gates of the Q-channel mixer 44. FIG. 4 illustrates the duty cycle and phases of the different clock signals.

The phases of the clock signals are staggered such that only one of the I/Q-channel mixers 42 or 44 is active at any point in time, where a positive clock pulse activates N-FET transistor gates and a negative clock pulse activates P-FET transistor gates. For example, when clock signal n1 and its compliment p1 are active (positive and negative, respectively) during the first phase, transistors N1, P1, N4, and P4 are on in the I-channel mixer 42 while all other transistors are off. As such, the I-channel mixer 42 outputs a differential In-phase signal component at the output nodes $I_+$ and $I_-$. When clock signal n2 and its compliment p2 are active during the second phase, transistors N5, P5, N8 and P8 are active in the Q-channel mixer 44 while all other transistors are off. Accordingly, the Q-channel mixer 44 outputs a differential Quadrature signal component at the output nodes $Q_+$ and $Q_-$. The remaining clock signals and their compliments are activated in turn, thus yielding differential I/Q signals.

The differential I/Q signals are then low-pass filtered to remove high frequency harmonics as previously described.

The frequencies of the four-phase clock signal and the RF input signal determine the baseband signal frequency. While a four-phase clocking scheme is preferred, any phase clocking scheme may be used such as two-phase local oscillation. Regardless, the conducting resistance of the complimentary passive mixer 24 is a function of the secondary winding bias voltage and the mixer input signal. Thus, as the mixer input signal fluctuates, so too does the conducting resistance of the complimentary passive mixer 24. As a result, the complimentary passive mixer 24 attenuates I/Q output signals more when the mixer's conducting resistance is high and less when its conducting resistance is low.

Preferably, the nonlinearity of the conducting resistance of the complimentary passive mixer 24 partly cancels LNA nonlinearity, thus improving the overall linearity of the receiver front-end 12. Nonlinearity occurs in the LNA 20 when the received RF signal r(t) approaches high signal levels, such as reaching a compression point of the LNA 20. When this occurs, the limited supply voltage available to the LNA 20 causes the LNA output to be clipped, thus reducing LNA gain for high input signal levels. The voltage output range of the LNA 20 is limited by the available supply voltage. This is particularly a concern when receiver components are fabricated using deep-sub micron CMOS technologies where very limited supply voltage ranges are available. To the contrary, LNA gain reduction is not a concern when the received RF signal is at a low level because the LNA 20 has sufficient output voltage margin. Preferably, the bias voltage applied to the secondary winding 34 causes the conducting resistance of the complimentary passive mixer 24 to vary in a manner that substantially cancels LNA nonlinear behavior at high signal levels. Nonlinearity cancellation may be valid only for certain ranges of signal levels beyond which linearity degrades sharply.

Figure 5:
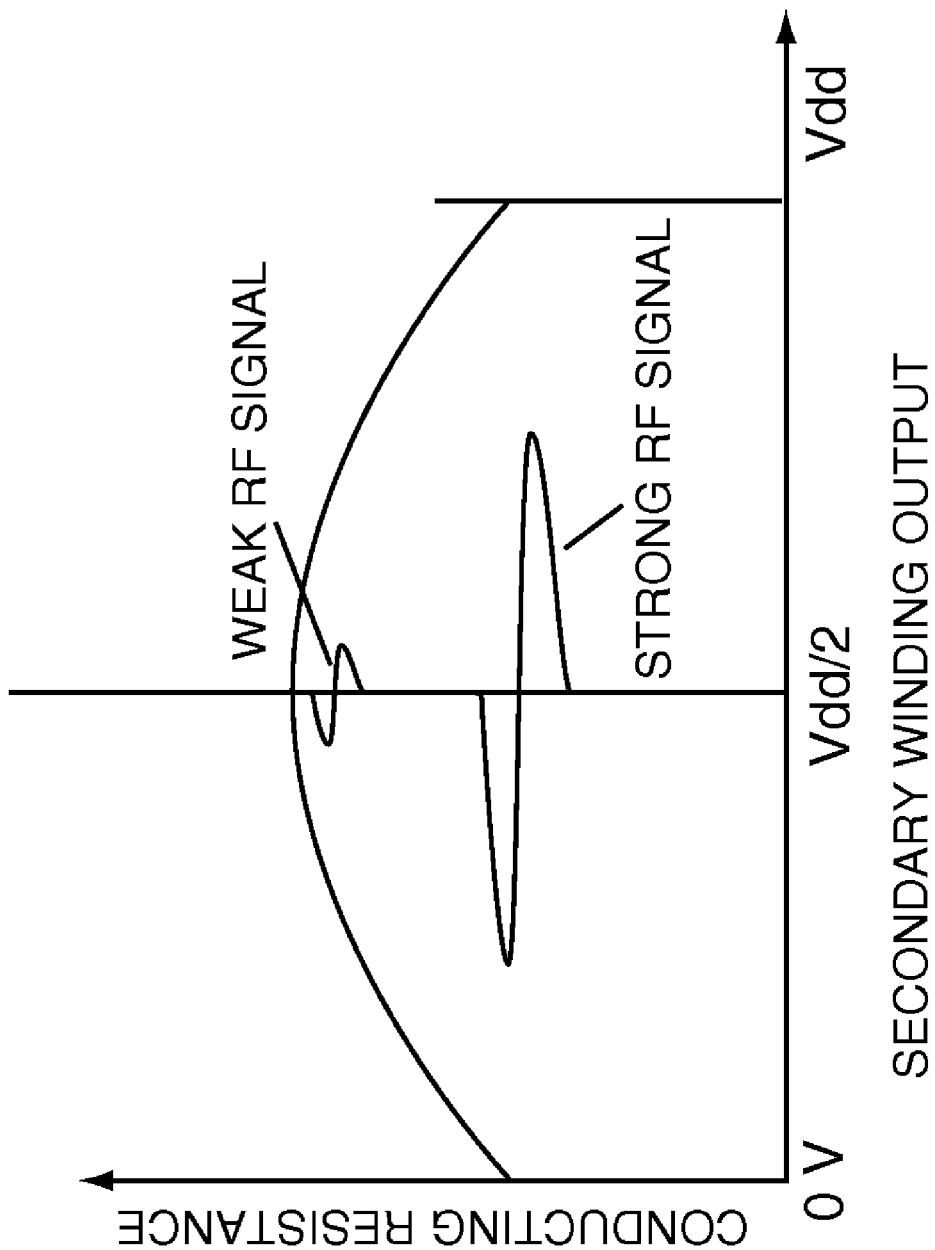
FIG. 5 is a graph diagram illustrating varying conducting resistance of one embodiment of a passive mixer.

By way of example, the secondary winding 34 is biased at approximately one half the supply voltage (Vdd/2). FIG. 5 graphically illustrates how the conducting resistance of the complimentary mixer 24 varies in response to the mixer input signal when the secondary winding 34 is biased at Vdd/2. Also illustrated in FIG. 5 are a weak RF signal (with small signal level) and a strong RF signal (with high signal level). The conducting resistance of the complimentary mixer 24 is low when the RF signal level is high, thus, the high level signal is subjected to less attenuation in the complimentary mixer 24. Recall, when the LNA output is high, nonlinearity may be present in the LNA 20, thus resulting in reduced LNA gain. The reduced conducting resistance lessens signal loss by the complimentary mixer 24, thus minimizing the effects of reduced LNA gain.

To the contrary, when the LNA output is low, the balun 22 output drifts toward the secondary winding bias voltage (Vdd/2 in this example). As such, voltages applied to the common nodes of the complimentary mixer 24 are both at approximately Vdd/2. When this occurs, the conducting resistance of the complimentary mixer 24 increases since the transistors that are activated have higher channel resistance, and thus conduct weakly. The mixer input signal is thus subjected to increased attenuation. As a result, low-level LNA output signals are attenuated more by the complimentary mixer 24 than are high-level LNA output signals.

Figure 6:
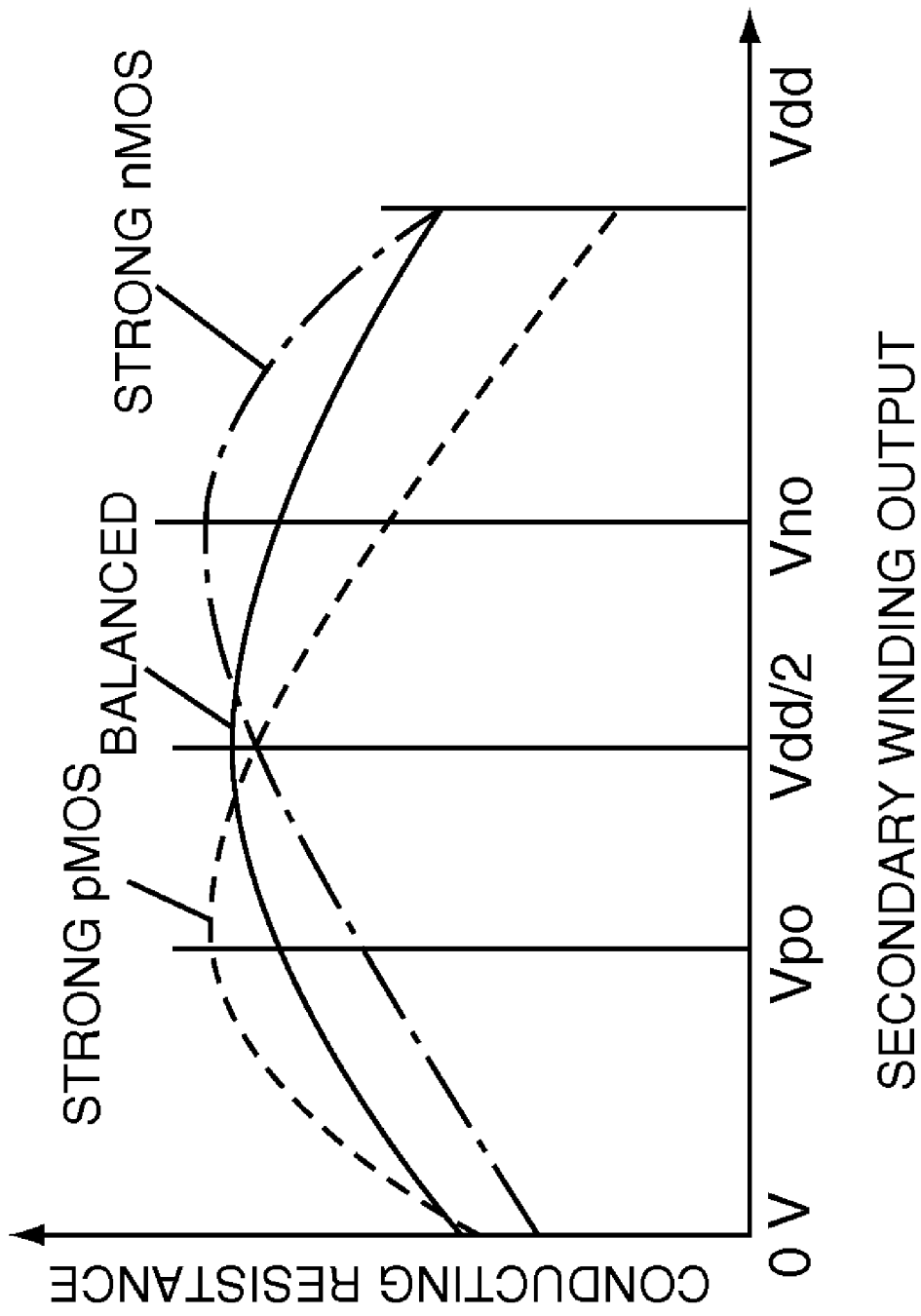
FIG. 6 is a graph diagram illustrating varying conducting resistance of another embodiment of a passive mixer due to process variation.

In the previous example, the selection of Vdd/2 for the secondary winding bias voltage presumes sufficient transistor matching in the complimentary passive mixer 24. However, if the current driving capabilities of the P-FETs and N-FETs forming the complimentary passive mixer 24 are not sufficiently balanced, e.g., due to process variation, the bias voltage applied to the secondary winding 34 may be altered to bring the complimentary mixer 24 back into balance, thus optimizing receiver front end linearity. For example, if the P-FETs have greater current drive capability than the N-FETs, the bias voltage applied to the secondary winding 34 is decreased below one half the supply voltage. By doing so, the channel resistance of the P-FET transistors is balanced at a new point Vpo as shown in FIG. 6. Likewise, if the N-FETs have greater current drive capability, the bias voltage applied to the secondary winding 34 is increased above one half the supply voltage also as shown in FIG. 6. By doing so, the channel resistance of the N-FET transistors is balanced at a new point Vno. As such, the bias voltage may be programmable to accommodate for transistor mismatches, e.g., due to process variations, temperature changes, etc.

Figure 7:
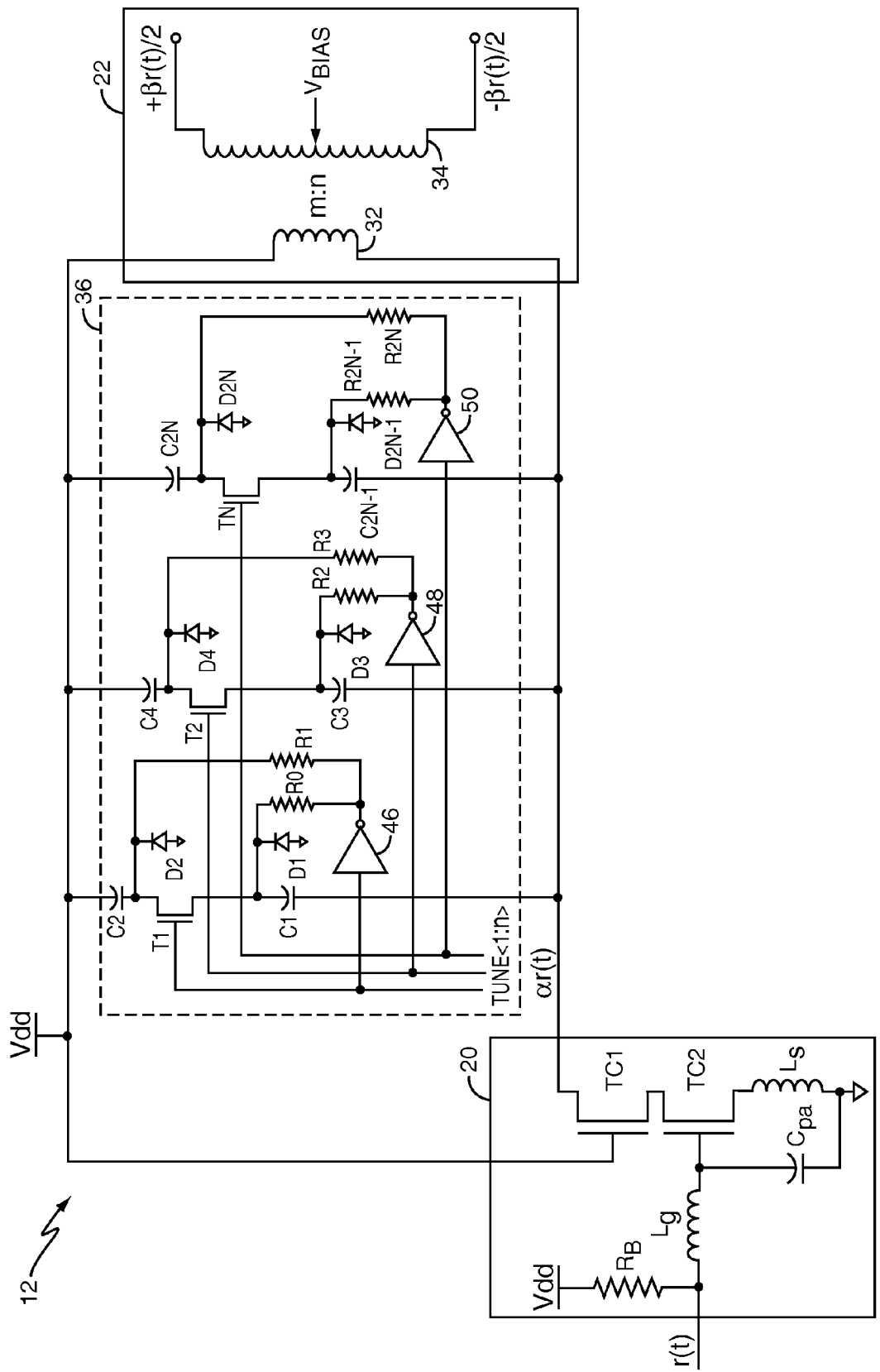
FIG. 7 is a block diagram of one embodiment of a frequency down conversion receiver having a frequency tuning capacitor array.

FIG. 7 illustrates an embodiment of the receiver front end 12 where the frequency tuning network 36 comprises a tuning capacitor array coupled to the primary winding 32 of the balun 22. The tuning capacitor array 36 comprises a plurality of control transistors T1-TN coupled in parallel. The source and drain of each control transistor has a tuning capacitor coupled thereto, e.g., C1 and C2 are coupled to T1, C3 and C4 are coupled to T2, etc. The control transistors T1-TN determine which capacitors are switched into the tuning network, thus determining the frequency tuning range of the receiver front-end 12.

Since the balun 22 provides positive voltage gain as previously described, the gain of the LNA 20 may be reduced to avoid nonlinearity. When LNA gain is reduced, the LNA output impedance becomes very low. Maintaining very low LNA output impedance enables the frequency tuning range of the receiver front-end 12 to be advantageously increased. To accommodate a desired increase in receiver frequency tuning range, the tuning capacitor array 36 adjusts its tuning capacitance accordingly. Thus, the tuning capacitor array 36 enables the LNA 20 to accommodate greater frequency tuning ranges.

The frequency tuning range r of the receiver front-end 12 is given by:

$$r \equiv \frac{f_{max}}{f_{min}} = \sqrt{\frac{Ct_{max} + Cp}{Ct_{min} + Cp}} \quad (3)$$

where $f_{max}$ and $f_{min}$ are the maximum and minimum operating frequencies of the receiver front-end 12, respectively, $Ct_{max}$ and $Ct_{min}$ are the maximum and minimum tuning capacitances of the tuning capacitor array 36, respectively, and Cp is the parasitic capacitance at the output node of the LNA 20. From equation (3), a decrease in the minimum tuning capacitance $Ct_{min}$ results in a corresponding increase in the frequency tuning range of the receiver front-end 12.

In more detail, the LNA 20 comprises first and second transistors TC1 and TC2. Transistors TC1 and TC2 form a cascaded LNA amplification stage for amplifying the received RF signal r(t). A bias resistor $R_B$ provides DC bias to the gate of transistor TC2 while the supply voltage Vdd biases the gate of transistor TC1. The received RF signal is coupled to the gate of TC2 via inductance Lg, where Cpa is the input parasitic capacitance and Ls is the source degeneration inductance. The cascaded amplifier stage formed by transistors TC1 and TC2 yields an amplified version αr(t) of the RF input signal. The amplified signal is provided to one end of the primary winding 32 while the opposite end is biased at the supply voltage Vdd. The tuning capacitor array 36 is coupled between the inputs to the primary winding 32 and determines the frequency tuning range of the receiver front-end 12.

A control word (TUNE<1:n>) input to the gates of the control transistors determines which transistors are switched on and which ones are not. The tuning capacitors coupled in series with each activated control transistor determine the overall tuning capacitance of the receiver front end 12 as given by equation (3). When one of the control transistors T1-TN is switched off, the corresponding parasitic diode pair D1/D2 through D2N-1/D2N associated with the source and drain of the deactivated control transistor contributes to the tuning capacitance. For example, if control transistor T1 is switched off, parasitic diodes D1 and D2 contribute junction capacitance to the ground node. As such, the tuning capacitance Ct is a function of the capacitance of capacitor C1 and the junction capacitance of diode D1. Diode D1 is reverse biased at a high potential to reduce its junction capacitance.

In general, an inverter 46-50 associated with each deactivated control transistor creates a high potential responsive to the control word and feeds it through corresponding resistor pairs R0/R1 and R2N-1/R2N to respective cathodes of the diode pair (D1/D2, D3/D4, D2N-1/D2N) associated with each deactivated control transistor. For example, if transistor T1 is deactivated, the control word causes inverter 46 to drive resistors R0 and R1 with a high potential which is applied to the cathodes of diodes D1 and D2. The bulk of the transistor T1-TN is biased to ground, so the parasitic diodes associated with the deactivated transistor are reversed biased, thus reducing the parasitic capacitance of the diodes. When one or more of the control transistors are switched on, the source and drain of each activated control transistor are preferably biased to ground to reduce the on-resistance associated with the activated transistors, thus enabling the frequency tuning capacitor array 36 to have high Q. Of course, various other tuning capacitor embodiments may be used to adjust the frequency tuning range of the receiver front-end 12 in response to changes in LNA output impedance, and thus, are within the scope of the present invention.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A frequency down-conversion receiver, comprising:
   a low-noise amplifier configured to generate an amplified single-ended signal responsive to a single-ended receiver input signal;
   a passive mixer configured to generate a mixer output signal responsive to a differential mixer input signal and a four-phase local oscillator signal;
   a balun configured to transform the amplified singled-ended signal into the differential mixer input signal, the balun having a first winding coupled to an output of the low-noise amplifier and a second winding coupled to an input of the passive mixer, the second winding having more turns than the first winding; and
   wherein a turn ratio of the second winding to the first winding is configured to provide gain compensation to the low-noise amplifier, and in conjunction with the low-noise amplifier and the passive mixer, to provide a desired gain to the receiver and linearity over a dynamic range of the receiver input signal.

2. The receiver of claim 1, further comprising a frequency tuning circuit coupled to the output of the low-noise amplifier, the frequency tuning circuit configured to adjust a tuning frequency range of the receiver.

3. The receiver of claim 2, wherein the frequency tuning circuit comprises at least one transistor coupled in series with one or more capacitive elements, the at least one transistor configured to switchably couple the corresponding one or more capacitive elements to the output of the low noise amplifier.

4. The receiver of claim 1, wherein the passive mixer comprises at least one complementary passive mixer.

5. The receiver of claim 4, wherein the at least one complementary passive mixer is configured to have an operating nonlinearity that compensates for low-noise amplifier nonlinearity.

6. The receiver of claim 5, wherein the second winding of the balun is configured to provide the differential mixer input signal to the at least one complementary passive mixer, the second winding biased with a voltage configured to, in conjunction with the differential mixer input signal, vary conducting resistance of the passive mixer to compensate for low-noise amplifier nonlinearity and improve linearity of the receiver.

7. The receiver of claim 6, wherein the bias voltage and the at least one complementary passive mixer are configured to increase the conducting resistance of the passive mixer responsive to the differential mixer input signal being at a weak level and decrease the conducting resistance of the passive mixer responsive to the differential mixer input signal being at a strong level.

8. The receiver of claim 6, wherein the bias voltage is tunable.

9. The receiver of claim 4, wherein the at least one complementary mixer comprises one or more sets of cascaded N-FET transistors and one or more sets of cascaded P-FET transistors.

10. The receiver of claim 9, wherein the bias voltage is selected to compensate for transistor mismatches between the N-FET and P-FET transistors.

11. The receiver of claim 1, further comprising a filter coupled to an output of the passive mixer, the filter configured to have a low input impedance for out-of-band signal frequencies.

12. The receiver of claim 11, wherein the receiver is configured to suppress signal interference caused by a transmitter associated with the receiver by transforming the input impedance of the filter to the output of the low-noise amplifier, the low input impedance of the filter for out-of-band frequencies configured to reduce output impedance of the low-noise amplifier for suppressing the signal interference at the output of the low-noise amplifier.

13. A wireless communication device including the receiver as claimed in claim 1, wherein the receiver comprises one of a homodyne-based receiver, a heterodyne-based low intermediate frequency receiver or a high intermediate frequency receiver.

14. A method of frequency conversion in a receiver, comprising:
   generating an amplified single-ended signal by a low-noise amplifier responsive to a single-ended receiver input signal;
   generating a mixer output signal by a passive mixer responsive to a differential mixer input signal and a four-phase local oscillator signal;
   coupling a first winding of a balun to an output of the low-noise amplifier and a second winding of the balun to an input of the passive mixer, the second winding having more turns than the first winding;
   transforming the amplified singled-ended signal into the differential mixer input signal by the balun; and
   wherein a turn ratio of the second winding to the first winding is configured to provide gain compensation to the low-noise amplifier, and in conjunction with the low-noise amplifier and the passive mixer, to provide a desired gain to the receiver and linearity over a dynamic range of the receiver input signal.

15. The method of claim 14, further comprising adjusting a tuning frequency range of the receiver.

16. The method of claim 15, wherein adjusting a tuning frequency range of the receiver comprises switchably coupling one or more capacitive elements to the output of the low noise amplifier.

17. The method of claim 14, further comprising operating the passive mixer in a nonlinear region to compensate for low-noise amplifier nonlinearity.

18. The method of claim 14, further comprising varying a conducting resistance of the passive mixer to compensate for low-noise amplifier nonlinearity.

19. The method of claim 18, wherein varying a conducting resistance of the passive mixer comprises:
   increasing the conducting resistance of the passive mixer responsive to the differential mixer input signal being at a weak level; and
   decreasing the conducting resistance of the passive mixer responsive to the differential mixer input signal being at a strong level.

20. The method of claim 18, wherein varying a conducting resistance of the passive mixer comprises biasing the second winding with a voltage configured to, in conjunction with the differential mixer input signal, vary the conducting resistance of the passive mixer to compensate for low-noise amplifier nonlinearity and improve linearity of the receiver.

21. The method of claim 20, further comprising selecting the bias voltage to compensate for transistor mismatches in the passive mixer.

22. The method of claim 14, wherein coupling the second winding of the balun to the input of the passive mixer comprises coupling the second winding to one or more complementary mixers in the passive mixer, the one or more complimentary mixers configured to have an operating nonlinearity that compensates for low-noise amplifier nonlinearity.

23. The method of claim 14, further comprising filtering out-of-band signal frequencies present in the mixer input signal.

24. The method of claim 14, further comprising suppressing signal interference caused by a transmitter associated with the receiver.

25. The method of claim 24, wherein suppressing signal interference caused by a transmitter associated with the receiver comprises transforming an input impedance of a filter coupled to an output of the passive mixer to the output of the low-noise amplifier.

* * * * *